United States Patent
Yang et al.

(10) Patent No.: US 9,458,857 B2
(45) Date of Patent: Oct. 4, 2016

(54) COOLING FAN AND COOLING DEVICE WITH COOLING FAN

(71) Applicant: HON HAI PRECISION INDUSTRY CO., LTD., New Taipei (TW)

(72) Inventors: Chih-Hao Yang, New Taipei (TW); Li-Kan Yeh, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 611 days.

(21) Appl. No.: 13/928,987

(22) Filed: Jun. 27, 2013

(65) Prior Publication Data

US 2014/0133974 A1  May 15, 2014

(30) Foreign Application Priority Data

Nov. 15, 2012  (TW) .............................. 101142539 A

(51) Int. Cl.
| | |
|---|---|
| *F04D 29/42* | (2006.01) |
| *F04D 17/16* | (2006.01) |
| *F04D 25/06* | (2006.01) |
| *H05K 7/20* | (2006.01) |

(52) U.S. Cl.
CPC ......... *F04D 29/4226* (2013.01); *F04D 17/162* (2013.01); *F04D 25/0613* (2013.01); *F04D 29/424* (2013.01); *F04D 29/4213* (2013.01); *H05K 7/20136* (2013.01)

(58) Field of Classification Search
CPC .... F04D 17/162; F04D 29/40; F04D 29/403; F04D 29/42; F04D 29/4226; F04D 29/4233; F04D 29/424; F04D 29/4246; F04D 29/4253; F04D 29/52; F04D 29/522; F04D 29/44; F04D 29/441; H05K 7/20136; H05K 7/20145; H05K 7/20172
See application file for complete search history.

(56) References Cited

U.S. PATENT DOCUMENTS

| | | | | |
|---|---|---|---|---|
| 7,255,533 | B2 * | 8/2007 | Takemoto | F04D 29/441 415/207 |
| 7,708,521 | B2 * | 5/2010 | Hwang | G06F 1/203 415/102 |
| 8,348,594 | B2 * | 1/2013 | Chen | F04D 29/4226 415/102 |
| 8,491,261 | B2 * | 7/2013 | Lin | F04D 25/0613 415/206 |
| 8,794,915 | B2 * | 8/2014 | Yamashita | F04D 17/162 415/206 |
| 2011/0058938 | A1 * | 3/2011 | Chen | F04D 29/4226 415/206 |
| 2012/0121407 | A1 * | 5/2012 | Yamashita | F04D 17/162 415/213.1 |
| 2012/0301281 | A1 * | 11/2012 | Wang | F04D 29/4226 415/182.1 |
| 2014/0133974 | A1 * | 5/2014 | Yang | F04D 17/162 415/206 |

* cited by examiner

Primary Examiner — Igor Kershteyn
Assistant Examiner — Christopher R Legendre
(74) Attorney, Agent, or Firm — Zhigang Ma

(57) ABSTRACT

A cooling fan includes a frame and a fan body. A bottom end of the frame forms a pressed portion that borders an air inlet. The pressed portion increases the size of the air inlet allowing more air to flow to better cool an electronic device.

17 Claims, 6 Drawing Sheets

COOLING FAN AND COOLING DEVICE WITH COOLING FAN

BACKGROUND

1. Technical Field

The present disclosure relates to a cooling fan and a cooling device, and particularly to a cooling fan and a cooling device in a thin electronic apparatus.

2. Description of Related Art

Generally, a cooling fan in an electronic device includes a frame and a fan body mounted in the frame. An air path is defined between the fan body and the frame. When the cooling fan is operated, air flows into the cooling fan from above or under the cooling fan and flows out of a side of the cooling fan via the air path. However, with electronic devices continuously becoming thinner, the cooling fan also needs to become thin, but the air path becomes increasingly narrower, which may affect air flow. This makes it harder to discharge heat from the electronic devices. Therefore, there is room for improvement in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

Figure 1:
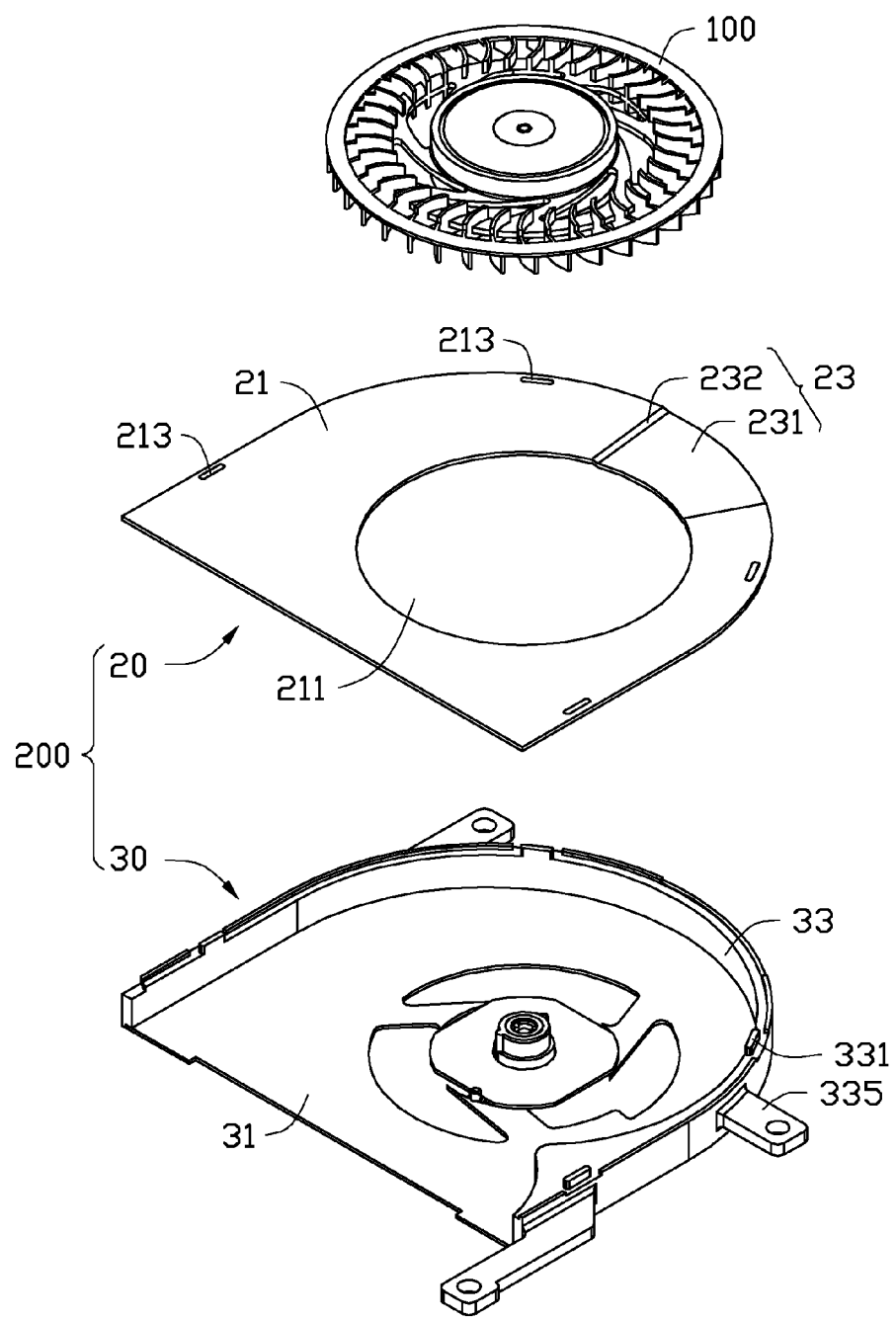
FIG. 1 is an exploded, isometric view of one embodiment of a cooling fan.

FIG. 1 shows a cooling fan including a fan body 100 and a frame 200.

The frame 200 includes a cover 20 and a case 30.

Figure 2:
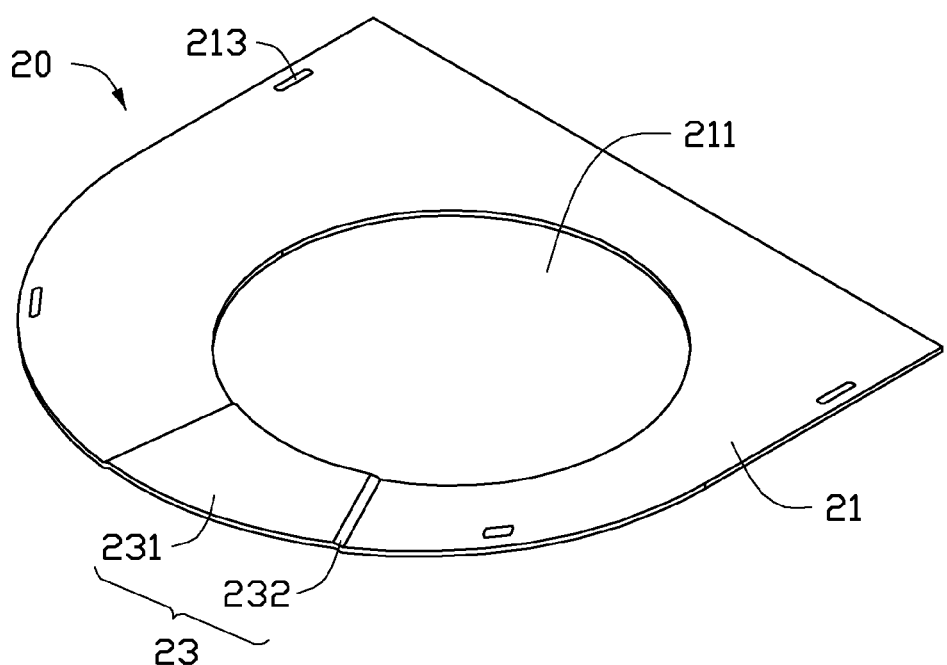
FIG. 2 is an isometric view of a cover of the cooling fan of FIG. 1.

FIG. 2 shows the cover 20 including a covering plate 21 and a pressed portion 23 defined in the covering plate 21. A center of the covering plate 21 defines an air inlet 211. The covering plate 21 defines a plurality of mounting holes 213. The pressed portion 23 borders an edge of the air inlet 211 and includes a first guiding piece 231 and two second guiding pieces 232. The two second guiding pieces 232 extend from opposite edges of the first guiding piece 231. In the embodiment, the first guiding piece 231 is substantially parallel to the covering plate 21, the second guiding pieces 232 are oblique relative to the covering plate 21 and the first guiding piece 231, and the air inlet 211 is circular. The second guiding pieces 232 define a space between them.

Figure 3:
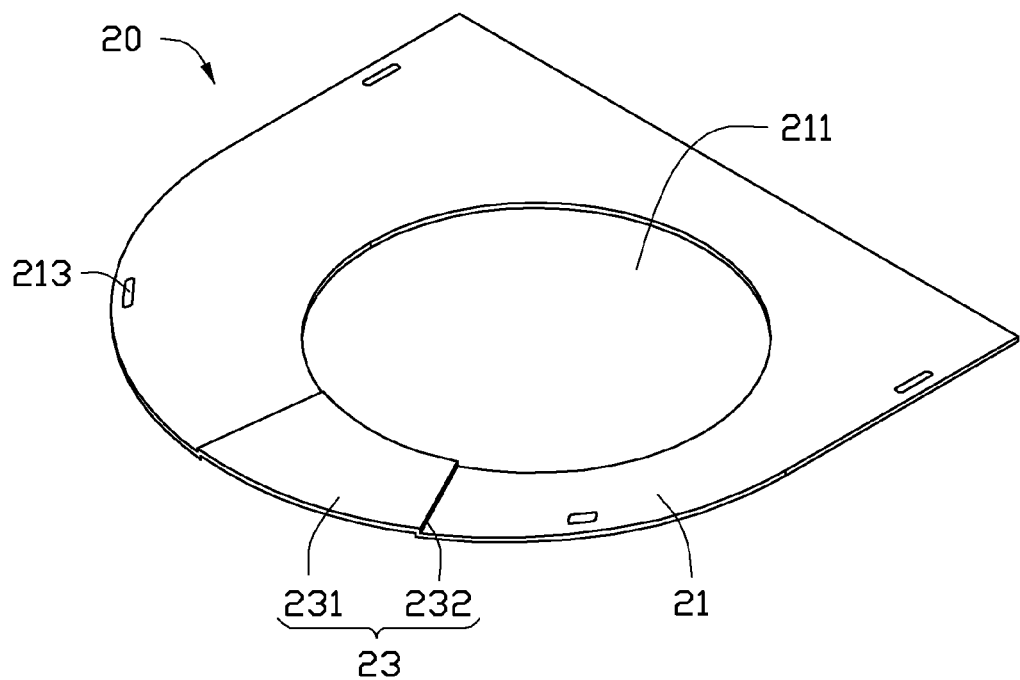
FIG. 3 is an isometric view of a second embodiment of the cover of the cooling fan of FIG. 1.
Figure 4:
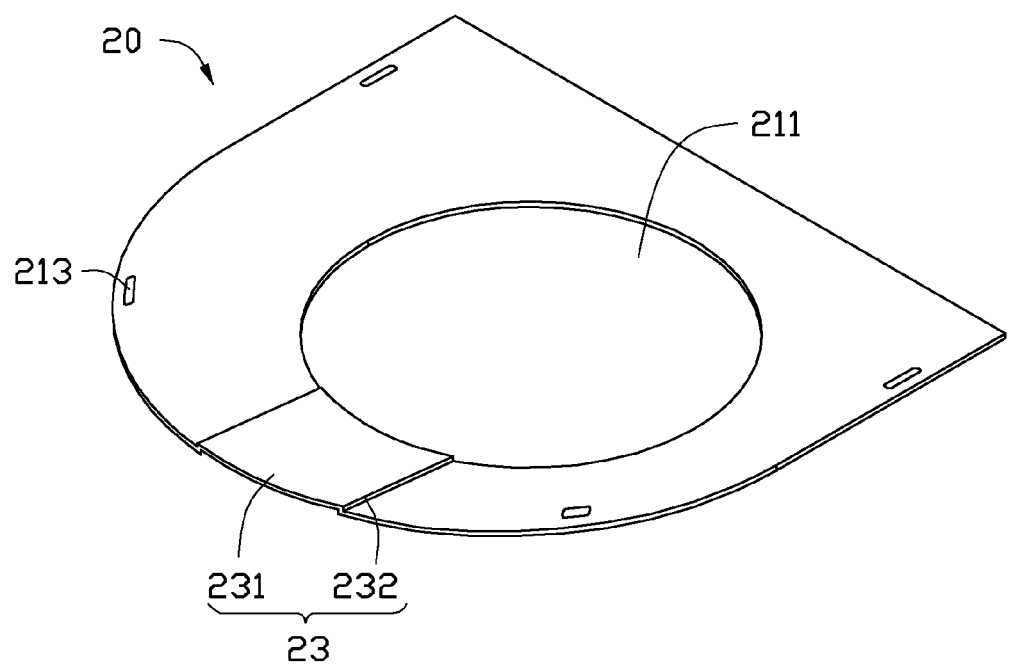
FIG. 4 is an isometric view of a third embodiment of the cover of the cooling fan of FIG. 1.

FIG. 3 and FIG. 4 show that, in a second embodiment, the second guiding pieces 232 are substantially perpendicular to the covering plate 21 and are oblique relative to each other. In a third embodiment, the second guiding pieces 232 are substantially perpendicular to the covering plate 21 and the first guiding piece 231 and are substantially parallel to each other.

The case 30 includes a bottom plate 31 and a side plate 33 extending around the edge of the bottom plate 31. A plurality of latching blocks 331 extends from a top surface of the side plate 33, and a plurality of mounting pieces 335 extends from a side surface of the side plate 33. The mounting pieces 335 mount the cooling device in an electronic device.

Figure 5:
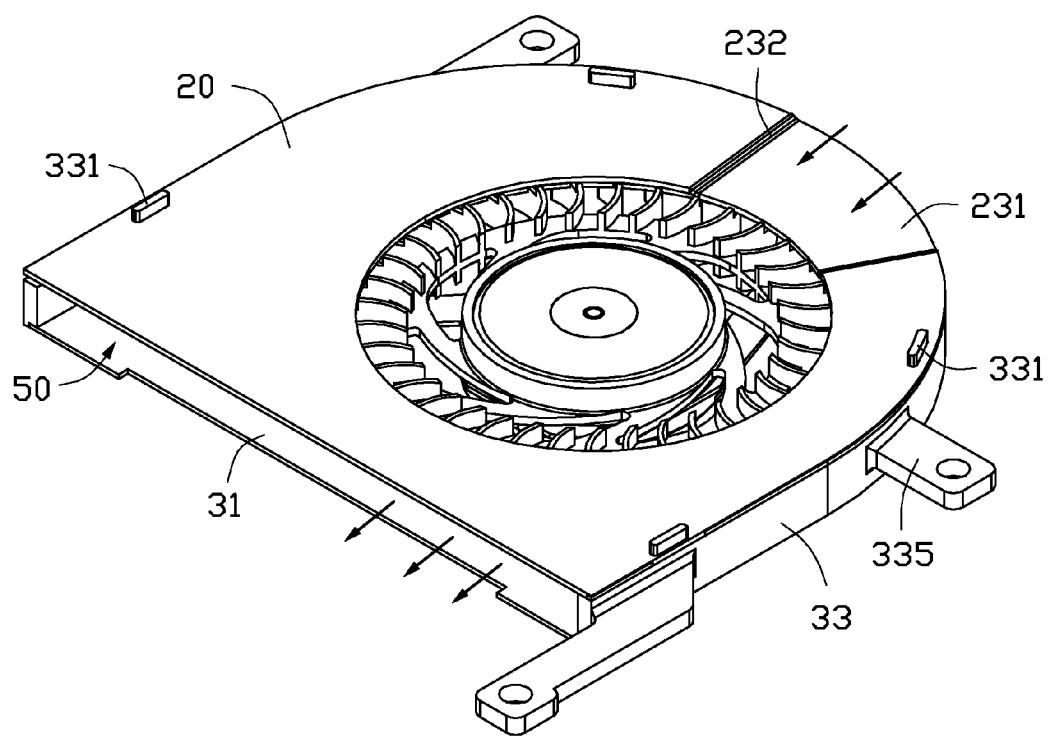
FIG. 5 is an assembled, isometric view of the cooling fan of FIG. 1.

FIG. 5 shows that in assembly, the fan body 100 is placed in the case 30 and is secured to the bottom plate 31 by screws or other conventional securing method. The latching blocks 331 are aligned with the plurality of mounting holes 213, the cover 20 is pressed downwards, and the latching blocks 331 are received in the mounting holes 213. Thus, the cover 20 is secured to the side plate 33 and covers the fan body 100. In one embodiment, the covering plate 21 is substantially parallel to the bottom plate 31, such that a distance between the first guiding piece 231 and the bottom plate 31 is less than a distance between the covering plate 21 and the bottom plate 31.

An air outlet 50 is defined between the covering plate 21 and the bottom plate 31. In the embodiment, the air outlet 50 is opposite to the pressed portion 23.

Figure 6:
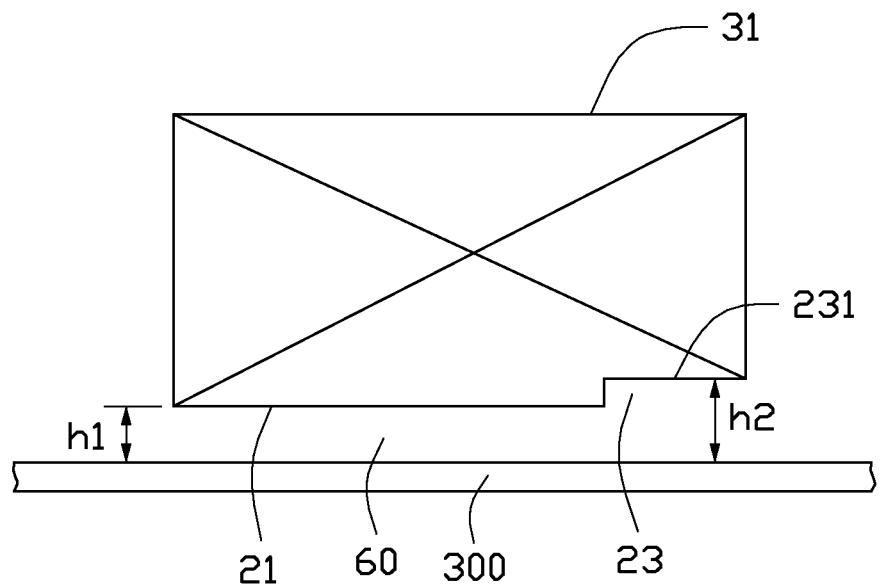
FIG. 6 is a schematic view of one embodiment of a cooling device.

FIG. 6 shows a cooling device including a bottom wall 300 of a chassis of an electronic apparatus and the cooling fan. In use, the cooling fan is secured to the bottom wall 300, and the covering plate 21 faces the bottom wall 300. A gap 60 is defined between the covering plate 21 and the bottom wall 300. A distance h1 between the covering plate 21 and the bottom wall 300 is less than a distance h2 between the first guiding piece 231 and the bottom wall 300. Air flows into the cooling fan via the gap 60 and the pressed portion 23 under the action of the fan body 100. The pressed portion 23 increases the gap 60, allowing more air to flow in to better cool the electronic device.

It is to be understood, however, that even though numerous characteristics and advantages have been set forth in the foregoing description of embodiments, together with details of the structures and functions of the embodiments, the disclosure is illustrative only and changes may be made in detail, especially in the matters of shape, size, and the arrangement of parts within the principles of the disclosure, to the full extent indicated by the broad general meaning of the terms in which the appended claims are expressed.

What is claimed is:

1. An electronic device comprising:
   a bottom wall of a chassis; and
   a cooling fan comprising a frame comprising a case and a cover covering the case and secured to the case; and
   a fan body mounted in the case;
   wherein an air outlet is defined between the cover and the case; the cover defines an air inlet; the cover comprises a covering plate, the case comprises a bottom plate; the covering plate further defines a pressed portion, the pressed portion extends towards the bottom plate and communicates with the air inlet;
   a first air path is defined by the pressed portion, the air inlet, and the air outlet; and a second air path is defined by the air inlet and the air outlet;

wherein the pressed portion extends from the covering plate; the pressed portion comprises a first guiding piece and two second guiding pieces, and the two second guiding pieces connect the first guiding piece to the covering plate; and the first guiding piece is substantially parallel to the covering plate.

2. The electronic device of claim 1, wherein the pressed portion is diametrically opposed to the air outlet with respect to the fan body; and a first direction of air flowing from the air inlet is substantially perpendicular to a second direction of air flowing from the pressed portion.

3. The electronic device of claim 1, wherein the bottom plate is substantially parallel to the covering plate; the fan body is secured to the bottom plate; and a distance between the first guiding piece to the bottom plate is less than a distance between the covering plate to the bottom plate.

4. A cooling fan comprising:
a frame comprising a case and a cover covering the case and secured to the case; and
a fan body mounted in the case;
wherein an air outlet is defined between the cover and the case; the cover defines an air inlet and a pressed portion communicating with the air inlet; a first air path is defined by the pressed portion, the air inlet, and the air outlet; and a second air path is defined by the air inlet and the air outlet, the cover comprises a covering plate, and the pressed portion extends from the covering plate; the pressed portion comprises a first guiding piece and two second guiding pieces, and the two second guiding pieces connect the first guiding piece to the covering plate; and the first guiding piece is substantially parallel to the covering plate.

5. The cooling fan of claim 4, wherein the pressed portion is diametrically opposed to the air outlet with respect to the fan body; and a first direction of air flowing from the air inlet is substantially perpendicular to a second direction of air flowing from the pressed portion.

6. The cooling fan of claim 4, wherein the case comprises a bottom plate, and the bottom plate is substantially parallel to the covering plate; the fan body is secured to the bottom plate; and a distance between the first guiding piece to the bottom plate is less than a distance between the covering plate to the bottom plate.

7. The cooling fan of claim 4, wherein each second guiding piece is substantially perpendicular to the covering plate and the first guiding piece.

8. The cooling fan of claim 4, wherein the two second guiding pieces are substantially parallel to each other.

9. The cooling fan of claim 4, wherein each second guiding piece is oblique relative to the covering plate and the first guiding piece.

10. The cooling fan of claim 4, wherein the two second guiding pieces are oblique relative to each other.

11. A cooling fan comprising:
a frame comprising a case and a cover covering the case and secured to the case; and
a fan body mounted in the case;
wherein an air outlet is defined between the cover and the case; the cover defines an air inlet and a pressed portion communicating with the air inlet; a first air path is defined by the pressed portion, the air inlet, and the air outlet; and a second air path is defined by the air inlet and the air outlet; the cover comprises a covering plate, the case comprises a bottom plate, the pressed portion comprises a first guiding piece, and the first guiding piece is substantially parallel to the covering plate and the bottom plate; and a distance between the first guiding piece to the bottom plate is less than a distance between the covering plate to the bottom plate.

12. The cooling fan of claim 11, wherein the pressed portion is diametrically opposed to the air outlet with respect to the fan body; and a first direction of air flowing from the air inlet is substantially perpendicular to a second direction of air flowing from the pressed portion.

13. The cooling fan of claim 11, wherein the pressed portion extends from the covering plate; the pressed portion further comprises two second guiding pieces, and the two second guiding pieces connect the first guiding piece to the covering plate.

14. The cooling fan of claim 13, wherein each second guiding piece is substantially perpendicular to the covering plate and the first guiding piece.

15. The cooling fan of claim 13, wherein the two second guiding pieces are substantially parallel to each other.

16. The cooling fan of claim 13, wherein each second guiding piece is oblique relative to the covering plate and the first guiding piece.

17. The cooling fan of claim 13, wherein the two second guiding pieces are substantially splayed.

* * * * *